(12) United States Patent
Kim

(10) Patent No.: US 8,314,916 B2
(45) Date of Patent: Nov. 20, 2012

(54) DISPLAY DEVICE AND MANUFACTURING METHOD THEREOF

(75) Inventor: Jong Soon Kim, Gyeongbuk (KR)

(73) Assignee: LG Display Co., Ltd., Seoul (KR)

( * ) Notice: Subject to any disclaimer, the term of this patent is extended or adjusted under 35 U.S.C. 154(b) by 621 days.

(21) Appl. No.: 12/495,917

(22) Filed: Jul. 1, 2009

(65) Prior Publication Data

US 2010/0139953 A1    Jun. 10, 2010

(30) Foreign Application Priority Data

Dec. 8, 2008  (KR) .................. 10-2008-0123994
Jun. 17, 2009  (KR) .................. 10-2009-0054001

(51) Int. Cl.
  *G02F 1/1345*  (2006.01)
(52) U.S. Cl. ........................ 349/149; 349/152
(58) Field of Classification Search ........... 349/149–152
  See application file for complete search history.

(56) References Cited

U.S. PATENT DOCUMENTS

| 4,836,651 A * | 6/1989 | Anderson ............... 349/150 |
| 6,284,086 B1 * | 9/2001 | Cardellino et al. ....... 156/273.7 |
| 2006/0244893 A1 * | 11/2006 | Oda ...................... 349/151 |

FOREIGN PATENT DOCUMENTS

JP            60103328 A  *  6/1985 .............. 349/149
KR      2001-0064618        7/2001

* cited by examiner

*Primary Examiner* — James Dudek
(74) *Attorney, Agent, or Firm* — Morgan, Lewis & Bockius LLP

(57) ABSTRACT

A display device which can prevent a contact defect of a driver IC and a manufacturing method thereof are disclosed. According to the method, a plurality of pattern lines and a plurality of contact electrodes on a substrate are formed. Each pattern line and each contact electrode are connected each other. Anisotropic conductive films, in which a plurality of conductive balls are included, on the substrate are arranged. A plurality of driving circuits on the substrate and allowing bumps of the driving circuits to be opposite the anisotropic conductive films are arranged. Pressure and heat are applied to the driving circuits such that the bumps of the driving circuits allow the conductive balls to be electrically connected to the contact electrodes. A plurality of contact layers connected with the conductive balls are formed by irradiating laser light on contact regions to melt the pattern lines and the contact electrodes.

17 Claims, 9 Drawing Sheets

DISPLAY DEVICE AND MANUFACTURING METHOD THEREOF

CROSS-REFERENCE TO RELATED APPLICATION

This application claims priority under 35 U.S.C. 119 to Korean Patent Application No. 10-20080123994, filed on Dec. 8, 2008 and 10-2009-0054001, filed on Jun. 17, 2009 which is hereby incorporated by reference in its entirety.

BACKGROUND

1. Field of the Disclosure

This disclosure relates to a display device, and more particularly to the display device of a chip-on-glass (COG) type preventing a contact defect of a driver integrated circuit chip, and a manufacturing method thereof.

2. Description of the Related Art

As the information society grows, flat display devices capable of displaying information have been widely developed. These flat display devices include liquid crystal display (LCD) devices, organic electro-luminescence display (OLED) devices, plasma display devices, and field emission display devices. Among the above display devices, LCD devices have the advantages that they are light and small and can provide a low power drive and a full color scheme. Accordingly, LCD devices have been widely used for mobile phones, navigation systems, portable computers, televisions and so on.

LCD devices include two substrates and a liquid crystal layer interposed between the substrates. A driver-integrated circuit is disposed on the peripheral region of the liquid crystal panel. The driver-integrated circuit is classified into a chip on glass (COG) type, a tape carrier package (TCP) type, or a chip on film (COF) type according to its loaded shape on the liquid crystal panel. Among these types, the COG type is mainly applied to liquid crystal panels of middle and small sizes because of its simple configuration and easy loading method.

FIG. 1 is a planar view showing an LCD device of the COG type according to the related art. As shown in FIG. 1, an LCD device of the COG type according to the related art includes first and second substrates 11 and 13, a liquid crystal layer (not shown) interposed between the substrates 11 and 13. A portion of the device in which the first and second substrates 11 and 13 overlap each other, is defined as a display area 9 displaying an image. The other portion of the device in which the first and second substrates 11 and 13 do not overlap each other is defined as a non-display area 10.

On the non-display area 10 of the first substrate 11, a flexible printed circuit (FPC) board 3 is connected with the first substrate 11, and gate-driving integrated circuits 5 and data-driving integrated circuits 25 to 27 are mounted. Such a configuration corresponds to the above COG type because the gate-driving integrated circuits 5 and the data-driving integrated circuits 25 to 27 are mounted on substrate 11, which is a glass material.

A plurality of pattern lines 15a to 15d, 17a, and 17b are formed on the non-display area 10. More specifically, the plural pattern lines include gate pattern lines 17a and 17b connecting the gate-driving integrated circuits 5 with the FPC board 3, and data pattern lines 15a to 15d connecting the data-driving integrated circuits 25 to 27 with the FPC board 3. The data-driving integrated circuits 25 to 27 are cascade-connected to one another by the data pattern lines 15a to 15d.

The gate-driving integrated circuits 5 are connected to the display area 9 by means of gate lines 21. The data-driving integrated circuits 25 to 27 are connected to the display area 9 by means of data lines 23.

A first data-driving integrated circuit 25 receives power signals VDD, VDD_gnd, VCC, and VCC_gnd, as well as a gamma voltage, a data signal, and a control signal, which are applied from the FPC board 3 through the data pattern lines 15a to 15d. Data voltages derived from the power signals VDD, VDD_gnd, VCC, and VCC_gnd, the gamma voltage, the data signal, and the control signal are applied to the display area 9 through the data lines 23.

Parts of the power signals VDD and VDD_gnd are reference voltages, while the rest of the power signals VCC, and VCC_gnd are drive voltages for driving the data-driving integrated circuits 25 to 27. These power signals VDD, VDD_gnd, VCC, and VCC_gnd have values desired by a specification (or a standard), but can be easily varied. The variation induces the data voltages output from the data-driving integrated circuits 25 to 27 to vary as well, thereby causing noise or a dim defect (A: area of causing block dim or block noise, FIG. 1). Actually, the power signals VDD, VDD_gnd, VCC, and VCC_gnd are varied by a contact defect between the data-driving integrated circuits 25 to 27 and the data pattern lines 15a to 15d upon the connection of the data-driving integrated circuits 25 to 27 and the data pattern lines 15a to 15d.

FIG. 2 is a planar view showing the data-driving integrated circuits shown in FIG. 1. As shown in FIG. 1, each of the data-driving integrated circuits 25 to 27 includes a plurality of bumps 31, 33, and 35. The bumps 31, 33, 35 function as cross-linking members which connect the respective data-driving integrated circuits 25, 26, or 27 to the data pattern lines 15a to 15d.

The bumps 31, 33, and 35 include input bumps 31 and output bumps 33 which are arranged on both horizontal edges of the respective data-driving integrated circuit 25, 26, or 27. They also include data signal output bumps 35 arranged on a longitudinal edge of the respective data-driving integrated circuit 25, 26, or 27. The input bumps 31 receive the power signals VDD, VDD_gnd, VCC, and VCC_gnd, as well as the gamma voltage, the data signal, and the control signal. The output bumps 33 output the power signals VDD, VDD_gnd, VCC, and VCC_gnd, and the gamma voltage, the data signal, and the control signal. The data signal output bumps 35 output the data voltages.

Similarly, the gate-driving integrated circuit 5 includes bumps which connect the gate-driving integrated circuit 5 to the gate pattern lines 17a and 17b and the gate lines 21.

FIG. 3 is a cross-sectional view showing the data-driving integrated circuit and the first substrate taken along the line I-I' shown in FIG. 2. As shown in FIG. 3, the substrate 11 includes a gate insulation film 43, data pattern lines 45, a passivation (or protective) film 47, and contact electrodes 48. The reference number "41" is a substrate. The gate insulation film 43 is formed on the non-display area 10 of the substrate 11. The data pattern lines 45 are formed separately from each other on the gate insulation film 43. In other words, the data pattern lines 45 are formed in input terminal portions and output terminal portions of the data-driving integrated circuits 25, 26 or 27, respectively. The passivation film 47 is formed to expose the data pattern lines 45 on the gate insulation film 43. The contact electrodes 48 are formed on the exposed data pattern lines 45. The contact electrodes 48 can electrically connect the respective data-driving integrated circuits 25, 26, or 27 to the data pattern lines 45.

The first substrate 11 further includes an anisotropic conductive film (ACF) 49 having a plurality of conductive balls 50 and disposed on its non-display area 10. The data-driving integrated circuit 26 which includes bumps 31 and 33 is disposed on the ACF 49. When the data-driving integrated circuit 26 is depressed by pressure upon heat, the bumps 31 and 33 of the depressed data driver integrated circuit 26 in turn depress the ACF 49, and the ACF 49 is molten. Thus, the conductive balls 50 included into the ACF 49 are electrically connected to the contact electrodes 48.

However, it is well-known that adhesions between the ACF 49 and/or the conductive balls 50 and contact electrodes 48 are so bad. In addition, as shown in FIG. 4, as the time passes by, the ACF 49 is hardened. Thus, the ACF 49 including the conductive balls 50 is detached from the contact electrodes 48 such that the conductive balls 50 are not connected to the contact electrodes 48 any more. Therefore, contact defects are generated in contact areas of the input terminal portions and/or the output terminal portions of the data-driving integrated circuits 25, 26 or 27. The contact defects can be defined as dimensions in which the bumps 31 and 33 overlap with the contact electrodes 48, respectively.

Furthermore, it is well-known that adhesions between the contact electrodes 48 and the data pattern lines 45 are comparatively bad. Contact defects are further generated in contact areas of the input terminal portions and/or the output terminal portions of the data-driving integrated circuits 25, 26 or 27.

Due to this contact defect, a contact resistance between the bump 31 or 33 of the data-driving integrated circuit 26 and the contact electrode 48 increases. Accordingly, the power signals VDD, VDD_gnd, VCC, and VCC_gnd, as well as the gamma voltage, the data signal, and the control signal vary due to the increased contact resistance. For instance, voltage levels of the power signals VDD and VCC decreases, whereas voltage levels of the power signals VDD_gnd and VCC_gnd increases. The power signals VCC and VCC_gnd are used to drive each data-driving integrated circuit 25, 26 and 27, and the power signals VDD and VDD_gnd are used as reference voltages for generating the gamma voltage.

As shown in FIG. 5, in the case where the power signals VCC and VCC_gnd are set at voltages of "2.7" and "0" according to design specifications (or standards), the power signal VCC drops to a voltage of "2.6" but the power signal VCC_gnd rises to a voltage of "0.4" when the contact resistance between the contact electrode 48 and the bump 31 or 33 of the data-driving integrated circuit is increased. As such, the margin width of VCC (i.e., a voltage difference between VCC and VCC_gnd) reduces from a voltage of "2.7V" down to a voltage of "2.2V". The data-driving integrated circuit 26 is then not driven due to the reduced margin width.

More specifically, contact defects can be generated at the input terminal portions and the output terminal portions of the data-driving integrated circuits 25 to 27, which are cascaded to one another and have a margin width with a voltage of "2.3". In this case, the margin width between the power signal VCC and the power signal VCC_gnd is increasingly reduced according to the procession of from the first data-driving integrated circuit 25 to the last data-driving integrated circuit 27. As such, the last integrated date driver circuit 27 and other data-driving integrated circuits (for example, a middle data driver integrated circuit 26) adjacent to it are not driven and no data voltages are applied to portions of the display area 9 opposite to the last integrated date driver circuit 27 and other adjacent data-driving integrated circuits 26. This can cause a block noise.

In addition, the increased contact resistance forces the power signal VDD to be lowered and the power signal VDD_gnd to be higher. This causes the generation of varied gamma voltages instead of the desired gamma voltages. The varied gamma voltages generate variations in the data voltages output from the data-driving integrated circuits 25 to 27, thereby causing a gray distortion. Such a gray distortion is more serious according to the procession of from the first data-driving integrated circuit 25 to the last data-driving integrated circuit 27. To rectify this, the gray distortion is generated on the data lines of the display area, which are connected to the last data-driving integrated circuit and the adjacent data-driving integrated circuits, due to the variation of the power signals VDD and VDD-gnd by the contact defect, resulting in a picture defect such as block dim is caused.

The contact defect is also generated between the bump 31 or 33, the data-driving integrated circuit 26 and the data line 23. The data voltage applied from the data-driving integrated circuit 26 to the data line 23 is distorted due to the contact defect.

In view of these points, it is necessary to fundamentally prevent the contact defect.

BRIEF SUMMARY

Accordingly, the present embodiments are directed to a display device that substantially obviates one or more of problems due to the limitations and disadvantages of the related art, as well as a manufacturing method thereof.

An object of the present embodiment is to provide a display device that electrically connects all conductive balls within a contact region to a contact electrode so as to prevent a contact defect, as well as a manufacturing method thereof.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, A method of manufacturing a display device includes: forming a plurality of pattern lines and a plurality of contact electrodes on a substrate, each pattern line and each contact electrode are connected each other; arranging anisotropic conductive films, in which a plurality of conductive balls are included, on the substrate; arranging a plurality of driving circuits on the substrate and allowing bumps of the driving circuits to be opposite the anisotropic conductive films; applying pressure and heat to the driving circuits such that the bumps of the driving circuits allow the conductive balls to be electrically connected to the contact electrodes; and forming a plurality of contact layers connected with the conductive balls by irradiating laser light on contact regions to melt the pattern lines and the contact electrodes.

A display device according to another aspect of the present embodiment includes: a substrate formed with a pattern line and a contact electrode; a driving circuit having a bump; an anisotropic conductive film having a plurality of conductive balls; and a contact layer formed by melting the pattern line and the contact electrode, wherein the contact layer is connected with the conductive balls.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
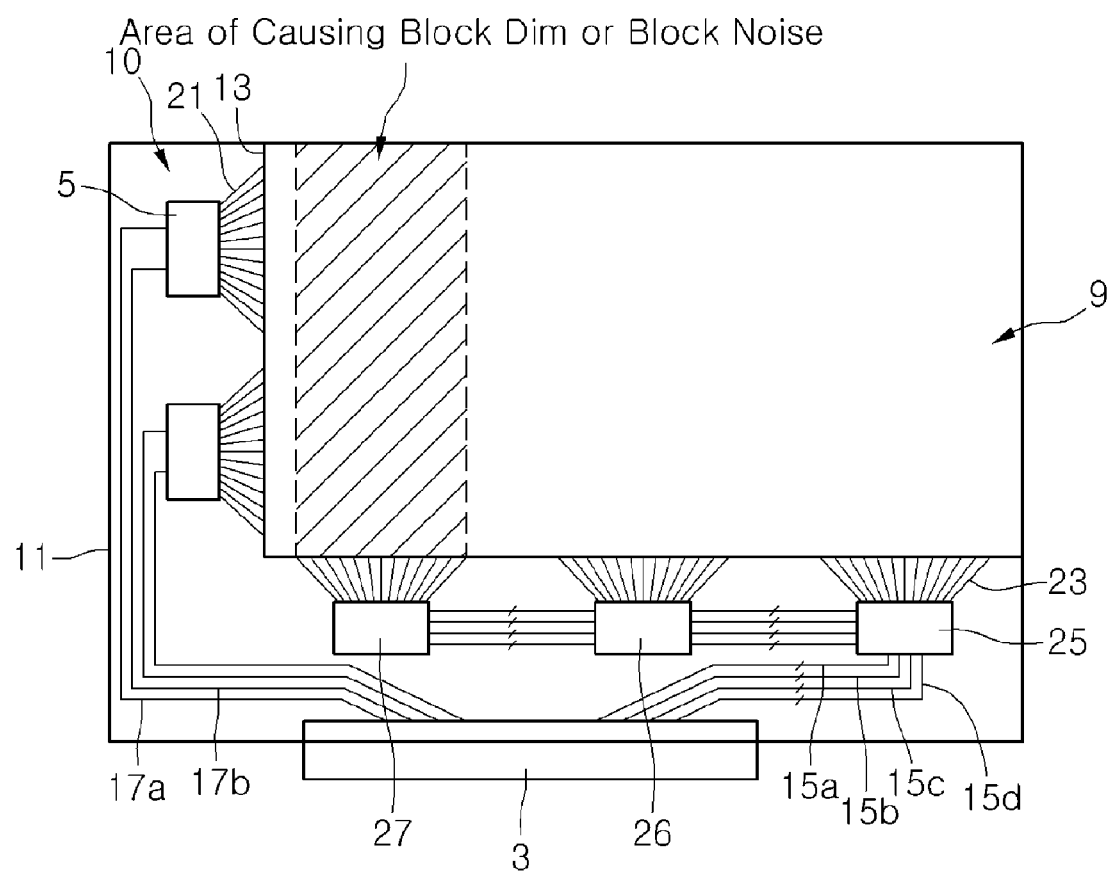
FIG. 1 is a planar view showing an LCD device of a COG type according to the related art.
Figure 2:
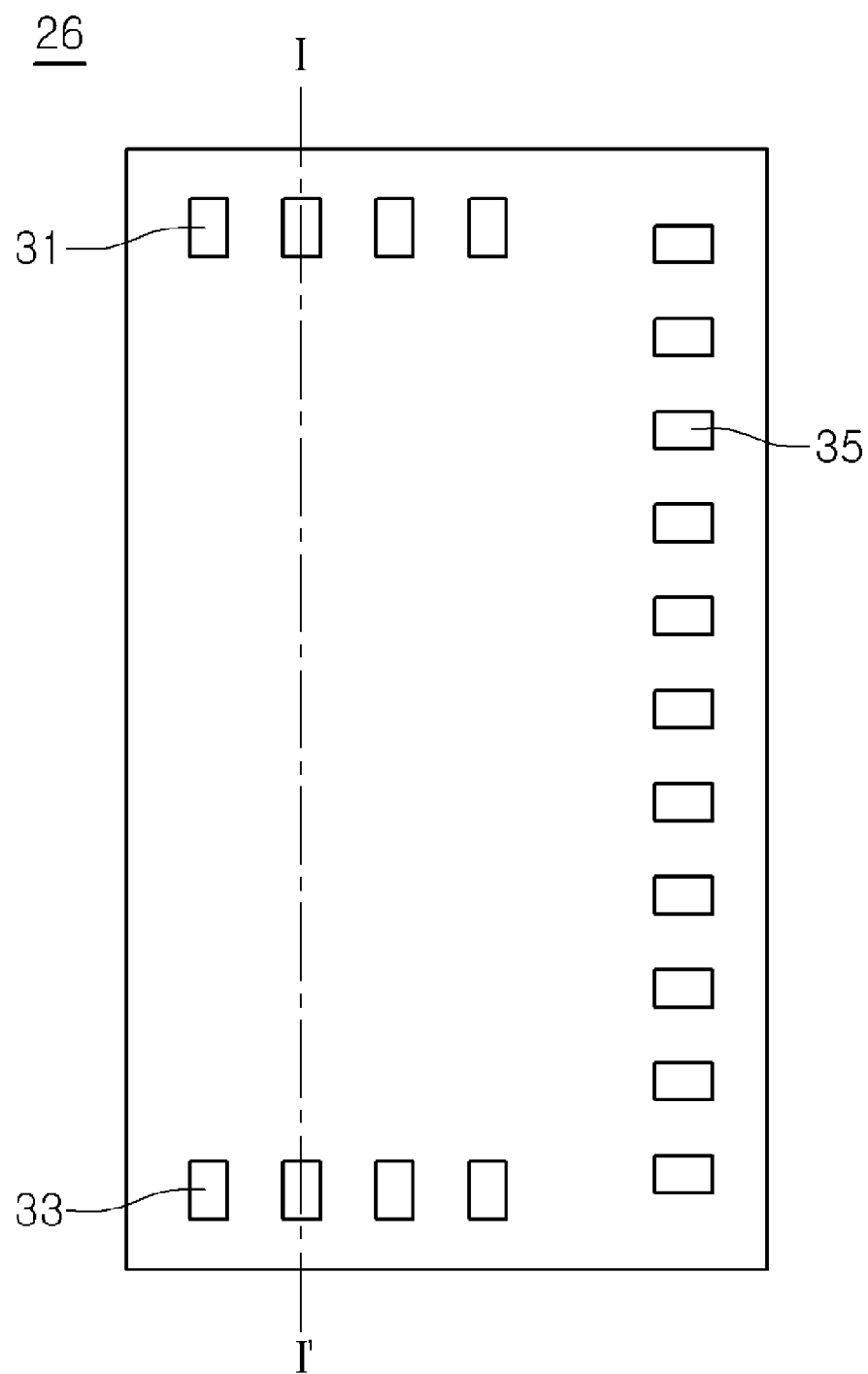
FIG. 2 is a planar view showing the data-driving integrated circuit shown in FIG. 1.
Figure 3:
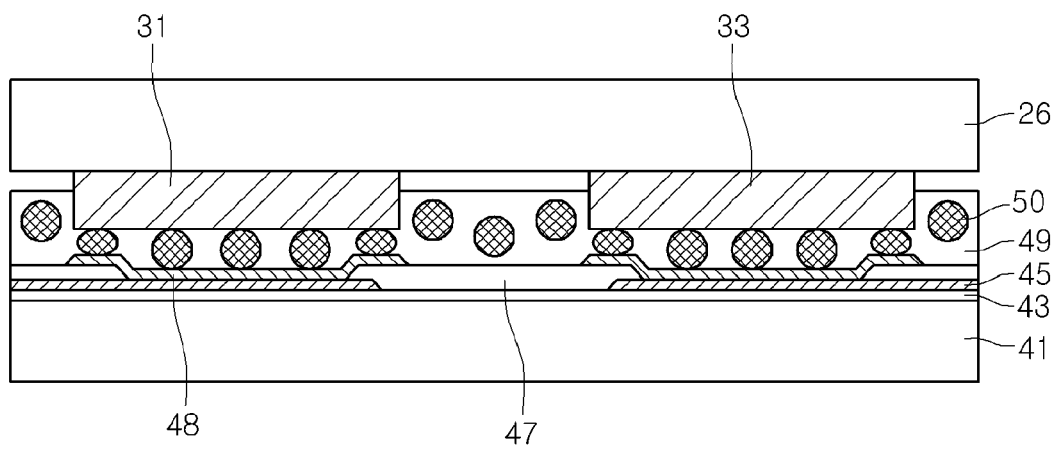
FIG. 3 is a cross-sectional view of the data-driving integrated circuit and the first substrate taken along the line I-I' in FIG. 2.
Figure 4:
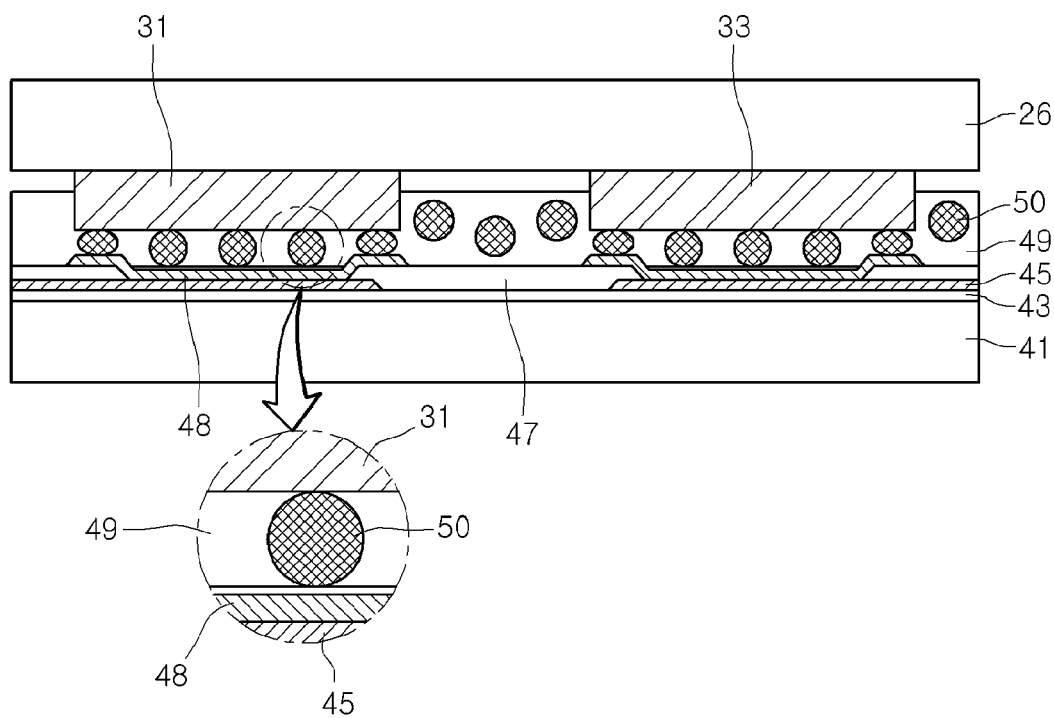
FIG. 4 shows contact defects in FIG. 3.
Figure 5:
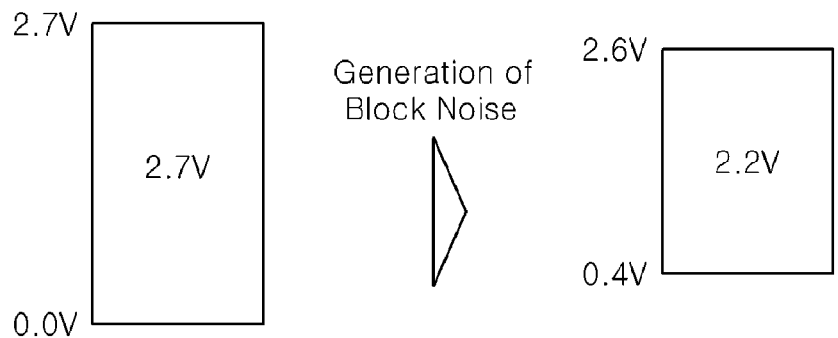
FIG. 5 is a view illustrating a variation in the voltage margin of a power signal caused by a contact defect.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 6:
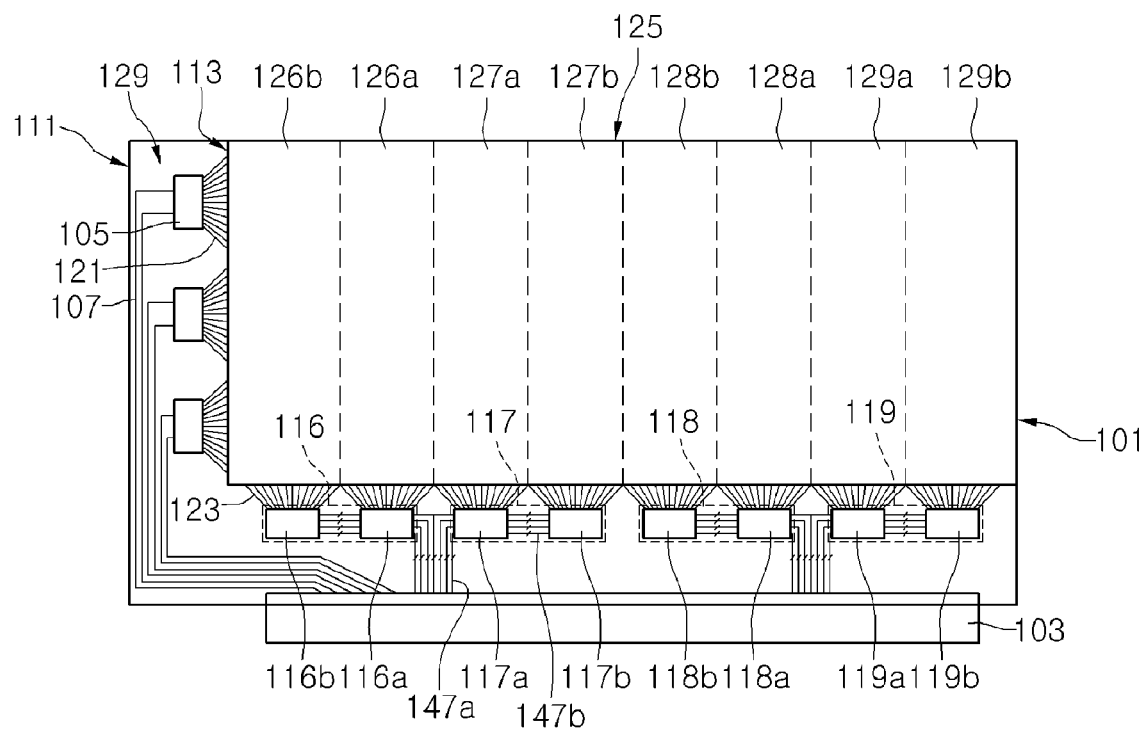
FIG. 6 is a planar view showing an LCD device of a COG type according to an embodiment of the present disclosure.

FIG. 6 is a planar view showing an LCD device of a COG type according to an embodiment of the present disclosure. Referring to FIG. 6, an LCD device of a COG type according to an embodiment of the present disclosure includes first and second substrates 111 and 113 and a liquid crystal layer (not shown) interposed between the substrates 111 and 113. The first and second substrates 111 and 113 together with the liquid crystal layer configure a liquid crystal panel 101. A portion of the panel in which the first and second substrates 111 and 113 overlap each other is defined as a display area 125 displaying an image. The other portion of the panel in which the first and second substrates 111 and 113 do not overlap each other is defined as a non-display area 129. The display area 125 is divided into a plurality of sub-display areas 126a, 126b, 127a, 127b, 128a, 128b, 129a and 129b.

On the non-display area 129 of the first substrate 111, a flexible printed circuit (FPC) board 103 is connected with the first substrate 111, and gate-driving integrated circuits 105 and data-driving integrated circuits 116a, 116b, 117a, 117b, 118a, 118b, 119a, and 119b are mounted. Such a configuration is called as a COG type because the gate-driving integrated circuits 105 and data-driving integrated circuits 116a, 116b, 117a, 117b, 118a, 118b, 119a, and 119b are mounted on the substrate 111 which is a glass material.

In this embodiment, a portion of the LCD panel in which the data-driving integrated circuits 116a, 116b, 117a, 117b, 118a, 118b, 119a, and 119b are arranged, is divided into a plurality of data driving regions 116 to 119. For instance, the data driving regions 116 to 119 each include two data-driving integrated circuits 116a and 116b, 117a, 117b, 118a and 118b, 119a and 119b. The data-driving integrated circuits 116a, 116b, 117a, 117b, 118a, 118b, 119a and 119b are opposite to the plurality of the sub-display areas 126a, 126b, 127a, 127b, 128a, 128b, 129a and 129b, respectively. Data signals from each of the data-driving integrated circuits 116a, 116b, 117a, 117b, 118a, 118b, 119a and 119b are displayed on each of the sub-display areas 126a, 126b, 127a, 127b, 128a, 128b, 129a and 129b, respectively.

More specifically, data signals from the data-driving integrated circuit 116a of the first data driving region 116 are displayed on the sub-display area 126a. Data signals from the data-driving integrated circuit 116b of the first data driving region 116 are displayed on the second display region 126b. Data signals from the data-driving integrated circuit 117a of the second data driving region 117 are displayed on the sub-display region 127a. Data signals from the data-driving integrated circuit 117b of the second data driving region 117 are displayed on the sub-display region 127b.

The data-driving integrated circuits 116a, 116b, 117a, 117b, 118a, 118b, 119a, and 119b on each of the data drive regions 116 to 119 are in a cascade. For example, the data-driving integrated circuits 116a and 116b disposed on the first data driving region 116 are in a cascade to each other. The data-driving integrated circuits 117a and 117b disposed on the second data driving region 117 are in a cascade to each other. The integrated data driver integrated circuits 118a and 118b disposed on the third data driving region 118 are in a cascade to each other. The data-driving integrated circuits 119a and 119b disposed on the fourth data driving region 119 are in a cascade to each other.

Power signals VDD, VDD_gnd, VCC, and VCC_gnd, as well as gamma voltages, a data signal, and a control signal, which are provided from the FPC board 103, are applied to the first to fourth data driving regions 116 to 119. The power signals VDD and VDD_gnd are reference voltages of the gamma voltages, while the power signals VCC and VCC-gnd are drive voltages used to drive the data-driving integrated circuits 116a to 119b.

The power signals VDD, VDD_gnd, VCC, and VCC_gnd, the gamma voltages, the data signal, and the control signal, which are provided from the FPC board 103, are applied to first data-driving integrated circuits 116a, 117a, 118a, and 119a each contained in the first to fourth data driving regions 116 to 119. The power signals VDD, VDD_gnd, VCC, and VCC_gnd, the gamma voltages, the data signal, and the control signal, which are applied to the first data-driving integrated circuits 116a, 117a, 118a, and 119a, are transferred to the second data-driving integrated circuits 116b, 117b, 118b, and 119b which are disposed adjacent to the first data-driving integrated circuits 116a, 117a, 118a, and 119a in a cascade. In this manner, the power signals VDD, VDD_gnd, VCC, and VCC_gnd, the gamma voltages, the data signal, and the control signal from the first data-driving integrated circuit 116a, 117a, 118a, or 119a on each of the data drive regions 116 to 119 can sequentially be transferred to the last of the cascaded data-driving integrated circuits.

More specifically, in the first data driving region 116, the power signals VDD, VDD_gnd, VCC, and VCC_gnd, the gamma voltages, the data signal, and the control signal, which are supplied to the first data-driving integrated circuit 116a, are transferred to the second data-driving integrated circuit 116b which are disposed adjacent to the first data-driving integrated circuit 116a in a cascade. In this manner, the power signals VDD, VDD_gnd, VCC, and VCC_gnd, the gamma voltages, the data signal, and the control signal can be applied to the last data-driving integrated circuit on the first data driving region 116a.

In the second data driving region 117, the power signals VDD, VDD_gnd, VCC, and VCC_gnd, the gamma voltages, the data signal, and the control signal, which are also supplied to the first data-driving integrated circuit 117a, are transferred to the second data-driving integrated circuit 117b which are disposed adjacent to the first data-driving integrated circuit 117a in a cascade. In this manner, the power signals VDD, VDD_gnd, VCC, and VCC_gnd, the gamma voltages, the data signal, and the control signal can be applied to the last data-driving integrated circuit on the second data driving region 117.

In the third data driving region 118, the power signals VDD, VDD_gnd, VCC, and VCC_gnd, the gamma voltages, the data signal, and the control signal, which are supplied to the first data-driving integrated circuit 118a, are transferred to the second data-driving integrated circuit 118b which are disposed adjacent to the first data-driving integrated circuit 118a in a cascade. In this manner, the power signals VDD, VDD_gnd, VCC, and VCC_gnd, the gamma voltages, the data signal, and the control signal can be applied to the last data-driving integrated circuit on the third data driving region 118.

In the fourth data driving region 119, the power signals VDD, VDD_gnd, VCC, and VCC_gnd, the gamma voltages, the data signal, and the control signal, which are supplied to the first data-driving integrated circuit 119a, are transferred to the second data-driving integrated circuit 119b which are disposed adjacent to the first data-driving integrated circuits 119a in a cascade. In this manner, the power signals VDD, VDD_gnd, VCC, and VCC_gnd, the gamma voltages, the data signal, and the control signal can be applied to the last data-driving integrated circuit on the fourth data driving region 119.

Data signals applied from the data-driving integrated circuits 116a and 116b, 117a and 117b, 118a and 118b, or 119a and 119b, which are included in each of the data drive regions 116 to 119, can be displayed on the respective sub-display area 126a, 126b, 127a, 127b, 128a, 128b, 129a and 129b opposite to each of the data-driving integrated circuits 116a and 116b, 117a and 117b, 118a and 118b, or 119a and 119b, as an image.

A plurality of pattern lines 107, 147a, and 147b are formed on the non-display area 129. More specifically, the pattern lines include gate pattern lines 107 connecting the gate-driving integrated circuits 105 with the FPC board 103, data pattern lines 147a connecting the data-driving integrated circuits 116a, 117a, 118a, and 119a with the FPC board 103, and data pattern lines 147b connecting between the data-driving integrated circuits 116a and 116b, 117a and 117b, 118a and 118b, and 119a and 119b adjacent to each other.

The gate-driving integrated circuits 105 are connected to the display area 125 by means of gate lines 121. The data-driving integrated circuits 116a, 116b, 117a, 117b, 118a, 118b, 119a, and 119b are connected to the display area 125 by means of data lines 123.

Each of the gate-driving integrated circuit 105 and the data-driving integrated circuits 116a, 116b, 117a, 117b, 118a, 118b, 119a, and 119b includes a plurality of bumps (not shown). The bumps function as cross-linking members which connect the gate-driving integrated circuit 105 to the gate pattern lines 107 and connect the respective data-driving integrated circuit 116a, 116b, 117a, 117b, 118a, 118b, 119a, and 119b to the data pattern lines 147a and 147b.

The bumps include input bumps electrically connected to input pattern lines 147a on input terminal portions of the gate-driving integrated circuit 105 and the data-driving integrated circuit 116a, 116b, 117a, 117b, 118a, 118b, 119a and 119b, output bumps electrically connected to output pattern lines 147b on output terminal portions of the gate-driving integrated circuit 105 and the data-driving integrated circuit 116a, 116b, 117a, 117b, 118a, 118b, 119a and 119b, and data signal output bumps electrically connected to the gate lines 121 and the data lines 123 on signal output terminal portions of the gate-driving integrated circuit 105 and the data-driving integrated circuit 116a, 116b, 117a, 117b, 118a, 118b, 119a and 119b.

The power signals VDD, VDD_gnd, VCC, and VCC_gnd, the gamma voltage, the data signal, and the control signal received by the input bumps of each of the data-driving integrated circuits 116a, 117a, 118a, and 119a are supplied to the input bumps of the other adjacent data-driving integrated circuits 116b, 117b, 118b, and 119b through the output bumps of each of the data-driving integrated circuits 116a, 117a, 118a, 119a. Data signals from the data signal output bumps of each data-driving integrated circuit 116a, 116b, 117a, 117b, 118a, 118b, 119a, and 119b are applied to each sub-display area 126a, 126b, 127a, 127b, 128a, 128b, 129a and 129b of the display area 125 through the data lines 123, respectively.

On contact regions defined between the bumps and the data pattern lines 147a and 147b, contact defects can be generated, due to the fact that conductive balls contained in ACF are detached from contact electrodes, and adhesions between the contact electrodes and the data pattern lines are comparatively bad.

In this way, the LCD device of the present embodiment divides two data-driving integrated circuits 116a and 116b, 117a and 117b, 118a and 118b, 119a and 119b on each of the data driving regions 116 to 119 in a cascade each other. Thus, power signals VDD, VDD_gnd, VCC, and VCC_gnd, the gamma voltages, the data signal, and the control signal from the FPC 103 are individually applied to each of the data driving regions 116 to 119.

As such, the number of the data-driving integrated circuits 116a and 116b, 117a and 117b, 118a and 118b, or 119a and 119b included in each of the data drive regions 116 to 119 is remarkably reduced compared with the related art, so that the power signals VDD, VDD_gnd, VCC, and VCC_gnd, the gamma voltages, the data signal, and the control signal applied to the last data-driving integrated circuit 116b, 117b, 118b, or 119b on each of the data drive regions 116 to 119 are hardly ever varied. Therefore, a block dim and/or noise is not generated.

FIGS. 7A to 7F are cross-sectional views showing a method of manufacturing an LCD device according to a first embodiment of the present disclosure. The method for manufacturing the data-driving integrated circuit 117a shown in FIGS. 7A to 7F can be applied to others of the data-driving integrated circuits divisionally included in the data driving regions, as described above. In addition, although FIGS. 7A to 7F will be limitedly explained referring only to a method of manufacturing an LCD device which prevents the above contact defects between bumps 156 of the data-driving integrated circuit 117a and data pattern lines 147a and 147b, the method according to an embodiment of the present disclosure is not limited to this. In other words, FIGS. 7A to 7F can be equally applied to another method of manufacturing an LCD device for preventing contact defects between bumps 156 of the data-driving integrated circuit 117a and data lines 123.

A method of manufacturing an LCD device will now be explained referring to FIGS. 6 and 7A to 7F.

Figure 7A:
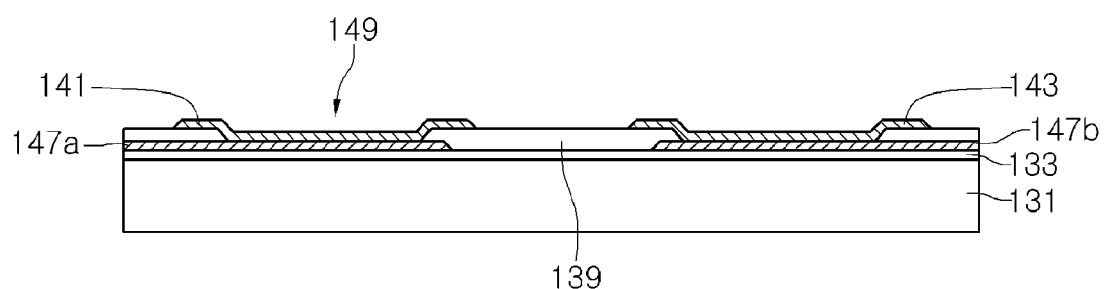
FIGS. 7A to 7F are cross-sectional views showing a method of manufacturing an LCD device according to a first embodiment of the present disclosure.

As shown in FIG. 7A, a first substrate 111 shown in FIG. 6 is manufactured by forming a gate insulation film 133, data pattern lines 147a and 147b, contact electrodes 141 and 143 and a passivation (or protective) film 139 on a substrate 131.

More specifically, gate lines 121 (not shown), gate electrodes (not shown), and gate pattern lines 107 are provided by forming a gate metal film (not shown) made of gate metal material on the substrate 131 and patterning the gate metal film. The gate lines 121 are formed on the display area 125. A plurality of pixels is defined on the display area 125. The gate lines 121 are formed extending onto the non-display area 129 as well as on the display area 125. The gate electrodes are formed on the respective pixels, and the gate pattern lines 107 are formed between the gate-driving integrated circuits 105 as well as between the gate-driving integrated circuits 105 and the FPC board 103.

The gate insulation film 133 is formed of a gate insulation material on an overall area of the substrate 131 which includes the gate lines 121.

Semiconductor layer patterns (not shown) are provided by forming and patterning a semiconductor material on the gate insulation film 133. Also, data lines 123, source/drain electrodes (not shown), and data pattern lines 147a and 147b are provided by forming and patterning a data metal film (not shown) made of data metal material on the substrate 131 including the semiconductor layer patterns. The data lines 123 are formed crossing the gate lines 121. The pixels are defined by the data lines 123 and the gate lines 121 crossing each other on the display area 125. The data lines 123 may be formed extending onto the non-display area 129 as well as on the display area 125. The source/drain electrodes are formed separately from each other at fixed intervals on the gate insulation film 133 opposite to the gate electrode. The data pattern lines 147a and 147b are formed between the data-driving integrated circuits 116a and 116b, 117a and 117b, 118a and 118b, and 119a and 119b, and between the data-driving integrated circuits 116a, 117a, 118a, 119a and the FPC board 103. The data metal material is identical to or is different from the gate metal material.

The gate electrode, the gate insulation film 133, the semiconductor layer pattern, and the source/drain electrodes may configure a thin film transistor. The thin film transistor is connected to the gate line 121 and the data line 123 defining the pixel.

The passivation (or protective) film 139 is formed of an organic or inorganic material on the substrate 131 which includes the data pattern lines 147a and 147b. Sequentially, the passivation film 139 is patterned, thereby forming drain contact holes (not shown) partially exposing the drain electrodes, data contact holes (not shown) exposing one ends of the data lines 123 extended to the non-display area 129, and data pattern line contact holes 149 partially exposing the data pattern lines 147a and 147b. In addition, the passivation film 139 and the gate insulation film 133 are patterned, thereby forming gate contact holes (not shown) exposing one ends of the gate lines 121 extended to the non-display area 129, and gate pattern line contact holes (not shown) partially exposing the gate pattern lines 107.

Pixel electrodes (not shown), gate contact electrodes (not shown), and data contact electrodes 141 and 143 are provided by forming and patterning a transparent conductive material film, such as indium-tin-oxide (ITO) or indium-zinc-oxide (IZO), on the passivation film 139. The pixel electrode is formed on the respective pixel and is electrically connected to the respective drain electrode through the respective drain contact hole. The gate contact electrodes are formed to be electrically connected with the gate line 121 through the gate contact holes. The gate contact electrodes are formed to be electrically connected with the gate pattern lines 107 through the gate pattern line contact holes. The data contact electrodes 141 and 143 are formed to be electrically connected with the data lines 123 through the data contact holes. The data contact electrodes 141 and 143 are formed to be electrically connected with the data pattern lines 147a and 147b through the data pattern line contact holes.

Figure 7B:
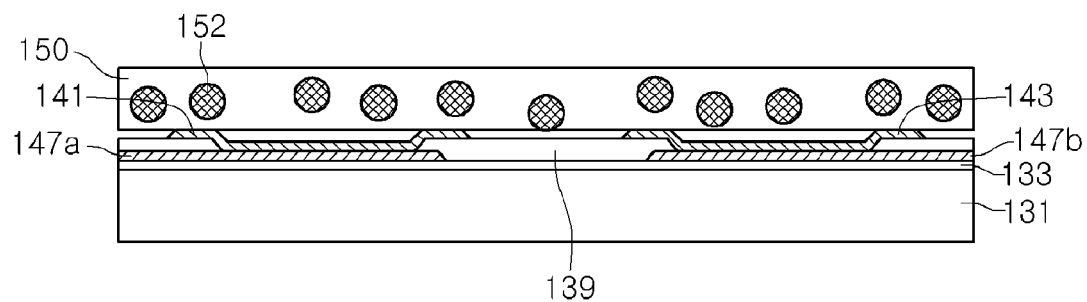

As shown in FIG. 7B, ACFs 150 are arranged on the non-display area 129 of the first substrate 111. Each of the ACFs 150 includes a plurality of conductive balls 152 randomly distributed in a region in which the gate-driving integrated circuits 105 and the data-driving integrated circuits 116a, 116b, 117a, 117b, 118a, 118b, 119a, and 119b are disposed. In other words, the ACFs 150 can be positioned under bumps of the gate- and data-driving integrated circuits 105, 116a, 116b, 117a, 117b, 118a, 118b, 119a, and 119b. More specifically, the ACFs 150 may be disposed on one ends of the gate lines 121, one ends of the data lines 123, both ends of the gate pattern lines 107, and both ends of the respective data pattern lines 147a and 147.

The gate-driving integrated circuits 105 and the data-driving integrated circuits 116a, 116b, 117a, 117b, 118a, 118b, 119a, and 119b are disposed to allow their bumps 156 to be opposite each of the ACFs 150.

Figure 7C:
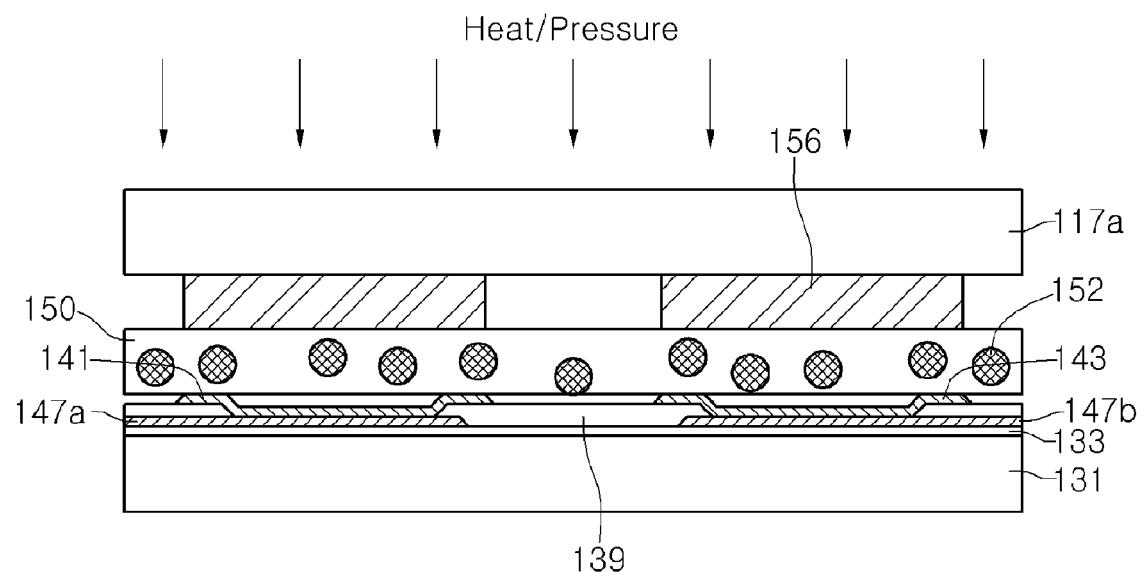

Sequentially, as shown in FIG. 7C, the gate-driving integrated circuits 105 and the data-driving integrated circuits 116a, 116b, 117a, 117b, 118a, 118b, 119a, and 119b are depressed by pressure upon heat, so that the bumps of the gate-driving integrated circuits 105 and the bumps 156 of the data-driving integrated circuits 116a, 116b, 117a, 117b, 118a, 118b, 119a, and 119b allow the conductive balls 152 to be connected to the gate lines 121, the gate pattern lines 107, the data lines 123, and the data pattern lines 147a and 147b.

More specifically, when the gate-driving integrated circuits 105 and the data-driving integrated circuits 116a, 116b, 117a, 117b, 118a, 118b, 119a, and 119b are depressed, the bumps in the gate-driving integrated circuits 105 and the bumps 156 in the data-driving integrated circuits 116a, 116b, 117a, 117b, 118a, 118b, 119a, and 119b depress and melt the respective ACFs 150. Accordingly, the bumps in the gate-driving integrated circuits 105 and the bumps 156 in the data-driving integrated circuits 116a, 116b, 117a, 117b, 118a, 118b, 119a, and 119b can be electrically connected to the gate contact electrodes and the data contact electrodes 141 and 143. Specially, the conductive balls 152 contained in each of the ACFs 150 can electrically be connected to the gate contact electrodes and the data contact electrodes 141 and 143.

Although all of the gate-driving integrated circuits 105 and the data-driving integrated circuits 116a, 116b, 117a, 117b, 118a, 118b, 119a, and 119b are simultaneously mounted on the first substrate 111, the method of the present embodiment is not limited to this. In other words, the gate-driving integrated circuits 105 and the data-driving integrated circuits 116a, 116b, 117a, 117b, 118a, 118b, 119a, and 119b can be sequentially mounted on the first substrate 111.

Figure 7D:
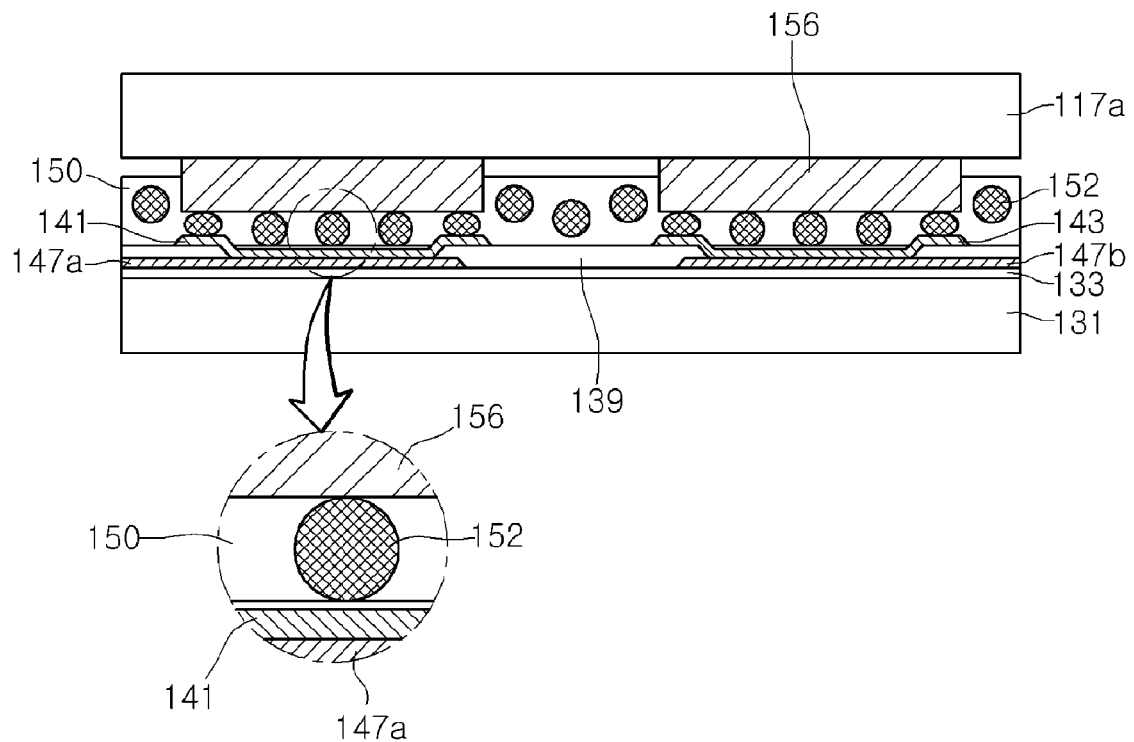

However, as shown in FIG. 7D, the ACFs 150 are hardened as the time passes by, and adhesions between the conductive balls 152 and ACFs 150 and the gate contact electrodes and data contact electrodes 141 and 143 and between the gate contact electrodes and data contact electrodes 141 and 143 and the gate lines 121, the gate pattern lines 107, the data lines 123 and the data pattern lines 147a and 147 are so bad. Thus, the conductive balls 152 and ACFs 150 are detached from the gate contact electrodes and data contact electrodes 141 and 143. In addition, the gate contact electrodes and data contact electrodes 141 and 143 may be detached from the gate lines 121, the gate pattern lines 107, the data lines 123 and the data pattern lines 147a and 147. Contact defects are generated in contact areas of the input terminal portions, the output terminal portions, and the signal output terminal portions of the gate- and data-driving integrated circuits 25, 26 or 27. Due to these contact defects, a contact resistance within the contact region increases and thus a defect involving a block dim or a block noise is generated.

Figure 7E:
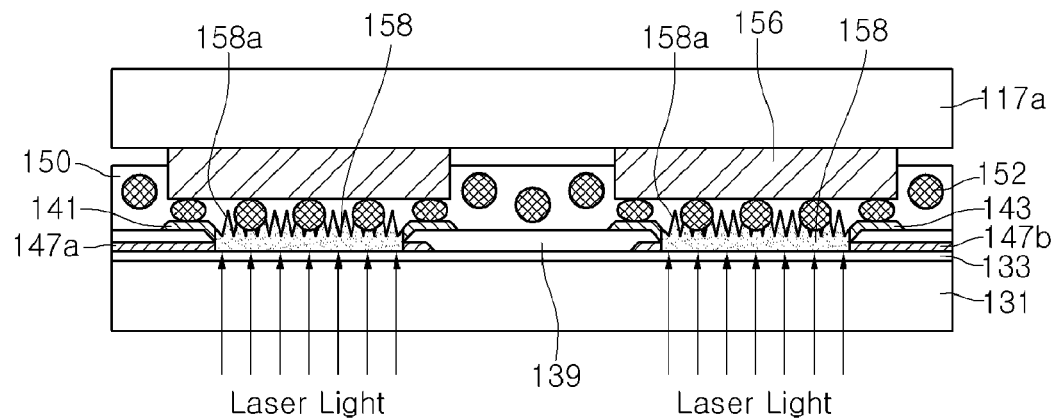

To resolve these problems, as shown in FIG. 7E, laser light (or laser beams) are irradiated from below the substrate 131 onto the inner contact region of the substrate 131 and thus two layers which are formed within the contact region, namely the gate lines 121 and the gate contact electrodes, the gate pattern lines 107 and the gate contact electrodes, the data lines 123 and the data contact electrodes 141 and 143, and the data pattern lines 147a and 147b and the data contact electrodes 141 and 143 are molten such that contact layers 158 are formed within each contact region. At the same time, a plurality of peaks 158a are formed on an upper surface of each contact layer 158 by laser light. The peaks 158a contact each conductive ball 152. The contact layer 158 is formed by melting two layers which are formed within the contact region, namely the gate lines 121 and the gate contact electrodes, the gate pattern lines 107 and the gate contact electrodes, the data lines 123 and the data contact electrodes 141 and 143, and the data pattern lines 147a and 147b and the data contact electrodes 141 and 143.

Figure 7F:
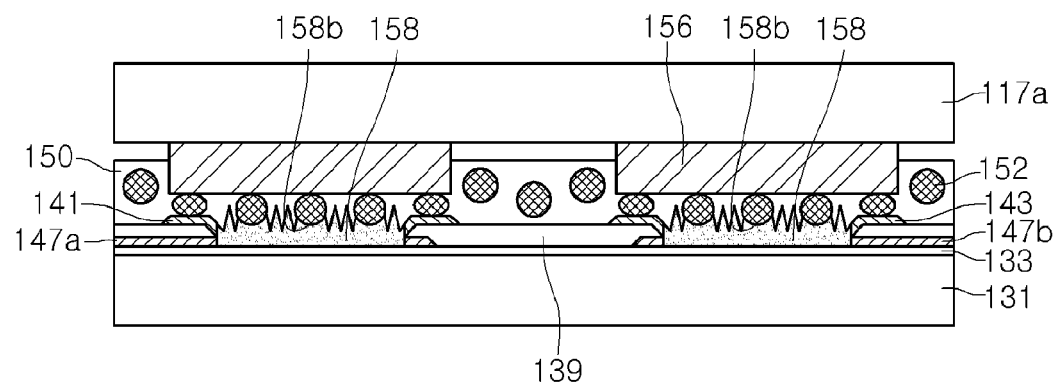

As shown in FIG. 7F, after the irradiation of laser light is over, as the time passes by, the peaks 158a contacted with each conductive ball 152 flow down along a surface of each conductive ball 152 to join each other together. In addition, the joined peaks 158b and the contact layers 158 are hardened. Thus, the conductive balls 152 is firmly attached and connected to the contact layer 158, in detail the joined peaks 158 within the contact region.

For the laser, any one of a ruby laser, a neodymium-doped yttrium aluminum garnet (Nd:YAG) laser, a KCl laser, a RbCl laser, and so on can be employed. It is preferable, however, to use a solid laser including Nd:YAG. The method of the present embodiment can use a pulse laser emitting pulsed laser light which has a power range of about 60 to 120 mJ.

In this way, since the conductive balls 152 within the contact regions are able to contact with the contact layers 158, the contact resistance is greatly reduced. Accordingly, desired power signals can be accurately transferred between the gate-driving integrated circuits 105 and the gate lines 121 or the gate pattern lines 107, and between the data-driving integrated circuits 116a, 116b, 117a, 117b, 118a, 118b, 119a, and 119b and the data lines 123 or the data pattern lines 147a and 147b, without variation.

More specifically, since the power signals VDD, VDD_gnd, VCC, and VCC_gnd, the gamma voltages, the data signal, and the control signal sensitive to the contact resistance between the data-driving integrated circuits 116a, 116b, 117a, 117b, 118a, 118b, 119a, and 119b and the data pattern lines 147a and 147b have no variation, none of a block dim and block noise is generated.

FIGS. 8A to 8E are cross-sectional views showing a method of manufacturing an LCD device according to a second embodiment of the present disclosure.

Figure 8A:
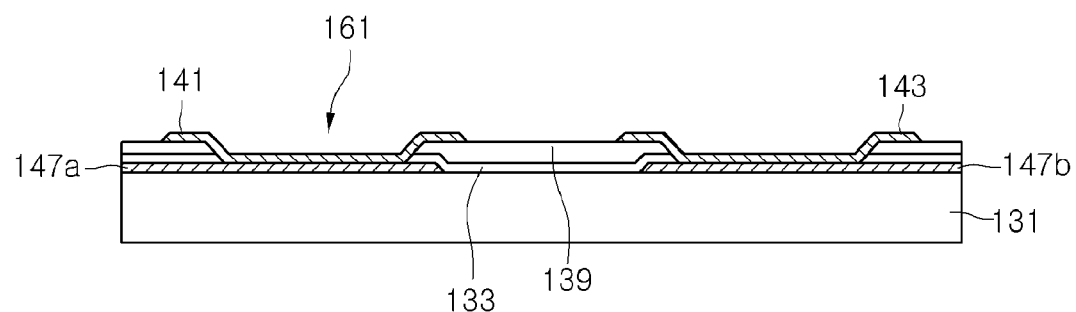
FIGS. 8A to 8E are cross-sectional views showing a method of manufacturing an LCD device according to a second embodiment of the present disclosure.

As shown in FIG. 8A, a first substrate 111 shown in FIG. 6 is manufactured by forming data pattern lines 147a and 147b, a gate insulation film 133, a passivation (or protective) film 139, and contact electrodes 141 and 143 on a substrate 131.

More specifically, gate lines 121, gate electrodes (not shown), gate pattern lines 107, and data pattern lines 147a and 147b are provided by forming a gate metal film (not shown) made of gate metal material on the substrate 131 and patterning the gate metal film. The gate lines 121 are formed on the display area 125. A plurality of pixels is defined on the display area 125. The gate lines 121 are formed extending onto the non-display area 129 as well as on the display area 125. The gate electrodes are formed on the respective pixels, the gate pattern lines 107 are formed between the gate-driving integrated circuits 105 and between the gate-driving integrated circuits 105 and the FPC board 103, and the data pattern lines 147a and 147b are formed between the data-driving integrated circuits 116a and 116b, 117a and 117b, 118a and 118b, and 119a and 119b, and between the data-driving integrated circuits 116a, 117a, 118a, 119a and the FPC board 103.

The gate insulation film 133 is formed of a gate insulation material on an overall area of the substrate 131 which includes the data pattern lines 147a and 147b.

Semiconductor layer patterns (not shown) are provided by forming and patterning a semiconductor material on the gate insulation film 133. Also, data lines 123 and source/drain electrodes (not shown) are provided by forming and patterning a data metal film (not shown) made of data metal material on the substrate 131 including the semiconductor layer patterns. The source/drain electrodes are formed separately from each other at fixed intervals on the gate insulation film 133 opposite to the gate electrode. The data metal material is identical to or is different from the gate metal material. The data lines 123 are formed crossing the gate lines 121. The pixels are defined by the data lines 123 and the gate lines 121 crossing each other on the display area 125. The data lines 123 may be formed extending onto the non-display area 129 as well as on the display area 125.

The gate electrode, the gate insulation film 133, the semiconductor layer pattern, and the source/drain electrodes may configure a thin film transistor. The thin film transistor is connected to the gate line 121 and the data line 123 defining the pixel.

The passivation (or protective) film 139 is formed of an organic or inorganic material on the substrate 131 which includes the data lines 123. Sequentially, the passivation film 139 is patterned, thereby forming drain contact holes (not shown) partially exposing the drain electrodes, and data contact holes (not shown) exposing one ends of the data lines 123 extended to the non-display area 129. In addition, the passivation film 139 and the gate insulation film 133 are patterned, thereby forming gate contact holes (not shown) exposing one ends of the gate lines 121 extended to the non-display area 129, gate pattern line contact holes (not shown) partially exposing the gate pattern lines 107, and data pattern line contact holes 161 partially exposing the data pattern lines 147a and 147b.

Pixel electrodes (not shown), gate contact electrodes (not shown), and data contact electrodes 141 and 143 are provided by forming and patterning a transparent conductive material film, such as indium-tin-oxide (ITO) or indium-zinc-oxide (IZO), on the passivation film 139. The pixel electrode is formed on the respective pixel and is electrically connected to the respective drain electrode through the respective drain contact hole. The gate contact electrodes are formed to be electrically connected with the gate line 121 through the gate contact holes. The gate contact electrodes are formed to be electrically connected with the gate pattern lines 107 through the gate pattern line contact holes. The data contact electrodes 141 and 143 are formed to be electrically connected with the data lines 123 through the data contact holes. The data contact electrodes 141 and 143 are formed to be electrically connected with the data pattern lines 147a and 147b through the data pattern line contact holes 161.

FIGS. 8B to 8E are approximately similar to FIGS. 7B to 7F except the data pattern lines 147a and 147b.

Figure 8B:
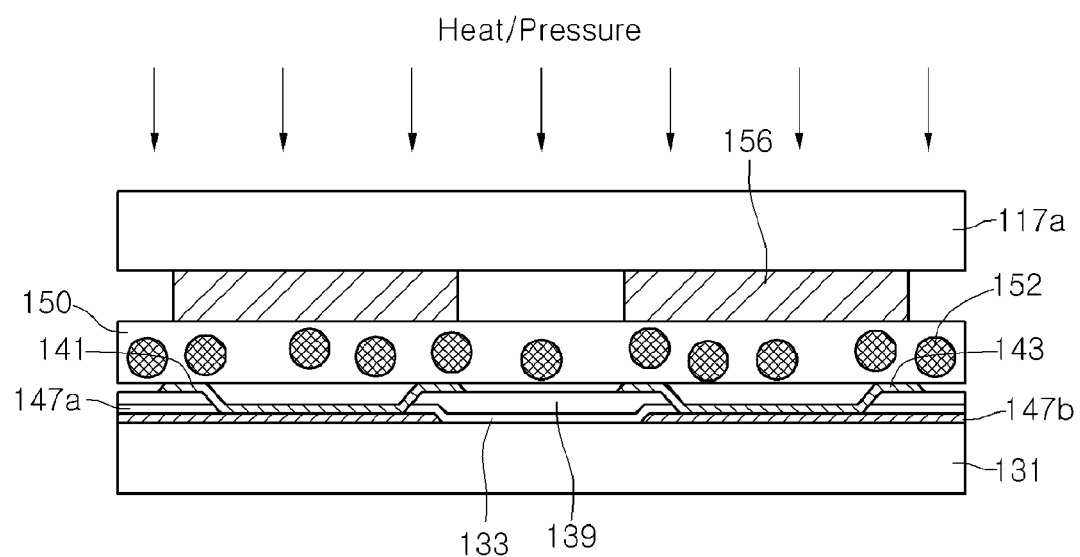

As shown in FIG. 8B, ACFs 150 are arranged on the non-display area 129 of the first substrate 111. Each of the ACFs 150 includes a plurality of conductive balls 152 randomly distributed in a region in which the gate-driving integrated circuits 105 and the data-driving integrated circuits 116a, 116b, 117a, 117b, 118a, 118b, 119a, and 119b are disposed. In other words, the ACFs 150 can be positioned under bumps of the gate- and data-driving integrated circuits 107, 116a, 116b, 117a, 117b, 118a, 118b, 119a, and 119b. More specifically, the ACFs 150 may be disposed on one ends of the gate lines 121, one ends of the data lines 123, both ends of the gate pattern lines 107, and both ends of the respective data pattern lines 147a and 147b.

The gate-driving integrated circuits 105 and the data-driving integrated circuits 116a, 116b, 117a, 117b, 118a, 118b, 119a, and 119b are disposed to allow their bumps 156 to be opposite each of the ACFs 150.

Sequentially, the gate-driving integrated circuits 105 and the data-driving integrated circuits 116a, 116b, 117a, 117b, 118a, 118b, 119a, and 119b are depressed by pressure upon heat, so that the bumps of the gate-driving integrated circuits 105 and the bumps 156 of the data-driving integrated circuits 116a, 116b, 117a, 117b, 118a, 118b, 119a, and 119b are connected to the gate lines 121, the gate pattern lines 107, the data lines 123, and the data pattern lines 147a and 147b.

More specifically, when the gate-driving integrated circuits 105 and the data-driving integrated circuits 116a, 116b, 117a, 117b, 118a, 118b, 119a, and 119b are depressed, the bumps in the gate-driving integrated circuits 105 and the bumps 156 in the data-driving integrated circuits 116a, 116b, 117a, 117b, 118a, 118b, 119a, and 119b depress and melt the respective ACFs 150. Accordingly, the bumps in the gate-driving integrated circuits 105 and the bumps 156 in the data-driving integrated circuits 116a, 116b, 117a, 117b, 118a, 118b, 119a, and 119b allow the conductive balls 152 to be electrically connected to the gate contact electrodes and the data contact electrodes 141 and 143.

Although all of the gate-driving integrated circuits 105 and the data-driving integrated circuits 116a, 116b, 117a, 117b, 118a, 118b, 119a, and 119b are simultaneously mounted on the first substrate 111, the method of the present embodiment is not limited to this. In other words, the gate-driving integrated circuits 105 and the data-driving integrated circuits 116a, 116b, 117a, 117b, 118a, 118b, 119a, and 119b can be sequentially mounted on the first substrate 111.

Figure 8C:
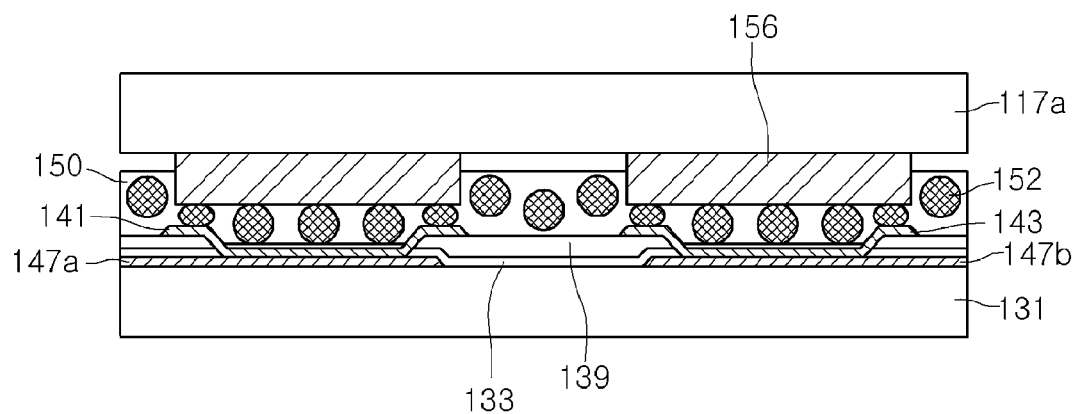

However, as shown in FIG. 8C, the ACFs 150 are hardened as the time passes by, and adhesions between the conductive balls 152 and ACFs 150 and the gate contact electrodes and data contact electrodes 141 and 143 and between the gate contact electrodes and data contact electrodes 141 and 143 and the gate lines 121, the gate pattern lines 107, the data lines 123 and the data pattern lines 147a and 147 are so bad. Thus, the contact balls 152 and ACFs 150 are detached from the gate contact electrodes and data contact electrodes 141 and 143. In addition, the gate contact electrodes and data contact electrodes 141 and 143 may be detached from the gate lines 121, the gate pattern lines 107, the data lines 123 and the data pattern lines 147a and 147. Contact defects are generated in contact areas of the input terminal portions, the output terminal portions, and the signal output terminal portions of the gate- and data-driving integrated circuits 25, 26 or 27. Due to these contact defects, a contact resistance within the contact region increases and thus a defect involving a block dim or a block noise is generated.

Figure 8D:
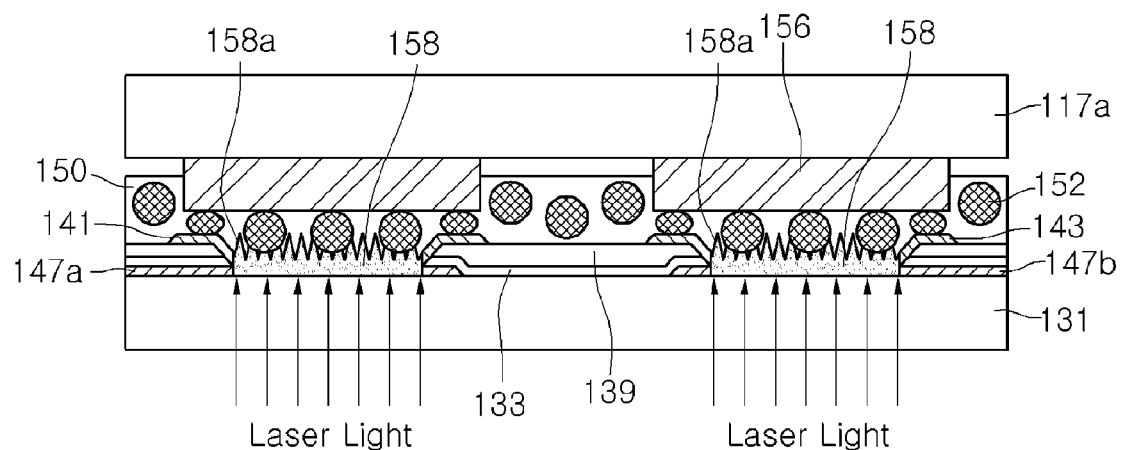

To resolve these problems, as shown in FIG. 8D, laser light (or laser beams) are irradiated from below the substrate 131 onto the inner contact region of the substrate 131 and thus two layers which are formed within the contact region, namely the gate lines 121 and the gate contact electrodes, the gate pattern lines 107 and the gate contact electrodes, the data lines 123 and the data contact electrodes 141 and 143, and the data pattern lines 147a and 147b and the data contact electrodes 141 and 143 are molten such that contact layers 158 are formed within each contact region. At the same time, a plurality of peaks 158a are formed on an upper surface of each contact layer 158 by laser light. The peaks 158a contact each conductive ball 152. The contact layer 158 is formed by melting two layers which are formed within the contact region, namely the gate lines 121 and the gate contact electrodes, the gate pattern lines 107 and the gate contact electrodes, the data lines 123 and the data contact electrodes 141 and 143, and the data pattern lines 147a and 147b and the data contact electrodes 141 and 143.

Figure 8E:
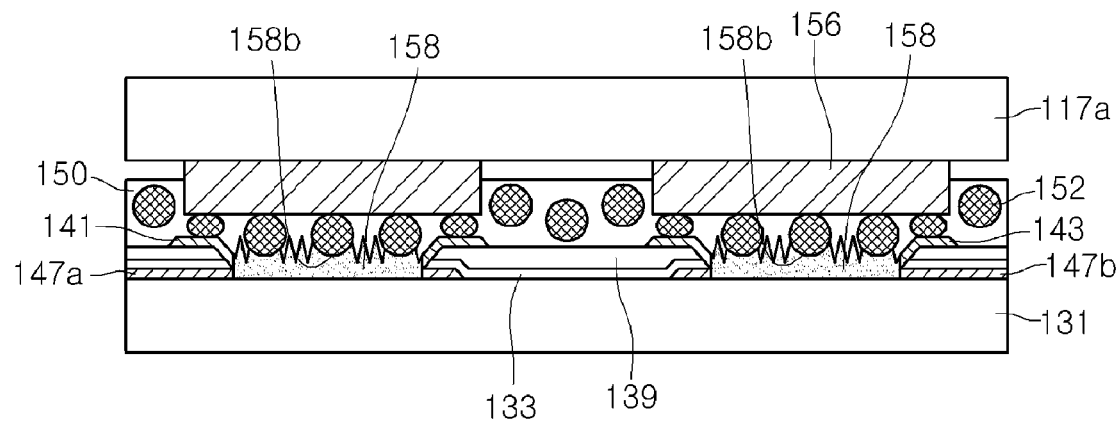

As shown in FIG. 8E, after the irradiation of laser light is over, as the time passes by, the peaks 158a contacted with each conductive ball 152 flow down along a surface of each conductive ball 152 to join each other together. In addition, the joined peaks 158b and the contact layers 158 are hardened. Thus, the conductive balls 152 is firmly attached and connected to the contact layer 158, in detail the joined peaks 158 within the contact region.

As described above, the present disclosure irradiate laser light on the contact regions and melt the data pattern lines and the data contact electrodes, forming the contact layers including the data pattern lines and the data contact electrodes. As such, the conductive balls causing the contact defect are forcibly connected to the contact layers, preventing a defect involving a block dim or a noise. In addition, the data pattern lines and the data contact electrodes are molten by laser light to mix the data pattern lines and the data contact electrodes. Thus, there is no adhesion problem between the gate lines and the gate contact electrodes, between the gate pattern lines and the gate contact electrodes, between the data lines and the data contact electrodes, and between the data pattern lines and the data contact electrodes. As a result, as contact defects are not generated picture-quality can be improved.

Although the embodiments of the present disclosure have been limitedly explained referring only to the LCD device described above, it should be understood that the present disclosure is not limited to these embodiments, but rather that various changes or modifications thereof are possible without departing from the spirit of the present disclosure. For example, the embodiments of the present disclosure can be applied to organic electro-luminescence display devices. Accordingly, the scope of the present disclosure shall be determined only by the appended claims and their equivalents.

What is claimed is:

1. A method of manufacturing a display device, the method comprising:
   forming a plurality of pattern lines and a plurality of contact electrodes on a substrate, each pattern line and each contact electrode are connected each other;
   arranging anisotropic conductive films, in which a plurality of conductive balls are included, on the substrate;
   arranging a plurality of driving circuits on the substrate and allowing bumps of the driving circuits to be opposite the anisotropic conductive films;
   applying pressure and heat to the driving circuits such that the bumps of the driving circuits allow the conductive balls to be electrically connected to the contact electrodes; and
   forming a plurality of contact layers connected with the conductive balls by irradiating laser light on contact regions to melt the pattern lines and the contact electrodes.

2. The method according to claim 1, wherein a plurality of peaks are formed on an upper surface of each contact layer by laser light.

3. The method according to claim 2, wherein the peaks contact each conductive ball.

4. The method according to claim 3, wherein the peaks flow down along a surface of each conductive ball to join each other together.

5. The method according to claim 4, wherein the joined peaks and the contact layers are hardened as the time passes by.

6. The method according to claim 1, wherein the laser light is emitted from a solid laser.

7. The method according to claim 6, wherein the solid laser includes one among a Nd:YAG laser, a ruby laser, a KCl laser, and RbCl laser.

8. The method according to claim 1, wherein the laser light is emitted from a pulsed laser having a power range of about 60 to 120 mJ.

9. The method according to claim 1, wherein the pattern lines include gate pattern lines and data pattern lines.

10. A display device comprising:
    a substrate formed with a pattern line and a contact electrode;
    an anisotropic conductive film having a plurality of conductive balls and formed on the substate;
    a driving circuit having a bump disposed on the anisotropic conductive film; and
    a contact layer formed by melting the pattern line and the contact electrode, wherein the contact layer is connected with the conductive balls.

11. The display device according to claim 10, further comprising:
    a gate line on the substrate;
    an insulating film on the substrate including the gate line;
    a data line crossing the gate line on insulating film;
    a passivation film on the substrate including the data line; and p1 a pixel electrode on the passivation film.

12. The display device according to claim 11, wherein the pattern line is formed together with the gate line.

13. The display device according to claim 12, wherein the contact electrode contacts the pattern line through the insulating film and the passivation film.

14. The display device according to claim 11, wherein the pattern line is formed together with the data line.

15. The display device according to claim 14, wherein the contact electrode contacts the pattern line through the passivation film.

16. The display device according to claim 11, wherein the contact electrode is formed together with the pixel electrode.

17. The display device according to claim 11, further comprising: a plurality of peaks on an upper surface of the contact layer to contact the conductive balls.

* * * * *